United States Patent
Ariffin et al.

(10) Patent No.: US 11,912,564 B2
(45) Date of Patent: Feb. 27, 2024

(54) SENSOR PACKAGE INCLUDING A SUBSTRATE WITH AN INDUCTOR LAYER

(71) Applicant: Knowles Electronics, LLC, Itasca, IL (US)

(72) Inventors: Adam Ariffin, Naperville, IL (US); Donald Yochem, Buffalo Grove, IL (US)

(73) Assignee: Knowles Electronics, LLC, Itasca, IL (US)

( * ) Notice: Subject to any disclaimer, the term of this patent is extended or adjusted under 35 U.S.C. 154(b) by 482 days.

(21) Appl. No.: 16/944,362

(22) Filed: Jul. 31, 2020

(65) Prior Publication Data
US 2022/0033248 A1    Feb. 3, 2022

(51) Int. Cl.
*B81B 7/00* (2006.01)
*H04R 19/04* (2006.01)

(52) U.S. Cl.
CPC .............. *B81B 7/008* (2013.01); *H04R 19/04* (2013.01); *B81B 2201/0221* (2013.01); *B81B 2201/0257* (2013.01); *H04R 2201/003* (2013.01)

(58) Field of Classification Search
CPC .............. B81B 7/0061; B81B 7/0077; B81B 2207/096; H05K 1/18; H05K 1/181; H05K 1/182; H05K 1/183; H05K 1/184; H05K 1/165; H01L 23/5227; H01L 23/645
See application file for complete search history.

(56) References Cited

U.S. PATENT DOCUMENTS

| | | | |
|---|---|---|---|
| 6,448,873 B1 | 9/2002 | Mostov | |
| 7,239,712 B1 | 7/2007 | Drury | |
| 7,529,103 B2 | 5/2009 | Chen | |
| 7,808,752 B2 | 10/2010 | Richiuso | |
| 8,791,783 B2 * | 7/2014 | Miyazaki | H01F 27/327 336/200 |
| 8,798,691 B2 | 8/2014 | Zhu | |

(Continued)

FOREIGN PATENT DOCUMENTS

| | | |
|---|---|---|
| CN | 102170605 | 8/2011 |
| TW | 201304564 | 1/2013 |
| WO | 2020023317 | 1/2020 |

OTHER PUBLICATIONS

Dong, Implementation of Multiparameter Monitoring by an LC-Type Passive Wireless Sensor Through Specific Winding Stacked Inductors, IEEE Internet of Things Journal, 10.1109/JIOT.2014.2385798, Dec. 24, 2014.

*Primary Examiner* — Jesse Y Miyoshi
(74) *Attorney, Agent, or Firm* — Loppnow & Chapa; Matthew C. Loppnow

(57) ABSTRACT

A sensor package can include a substrate including a plurality of layers. The plurality of layers can include a first pair of layers and a second pair of layers different from the first pair of layers. The substrate can have a first side and a second side opposite the first side. The sensor package can include a transducer coupled to the second side of the substrate. The sensor package can include an inductor electrically coupled to the transducer. The inductor can be configured as a single layer trace on an inductor layer within the substrate and disposed between the first pair of layers within the substrate. The first pair of layers can be more distal from the second side of the substrate than the second pair of layers.

16 Claims, 6 Drawing Sheets

(56) References Cited

U.S. PATENT DOCUMENTS

| | | | |
|---|---|---|---|
| 9,040,360 B1 | 5/2015 | Minervini | |
| 9,123,991 B2 | 9/2015 | Kang | |
| 9,478,976 B2 | 10/2016 | Park | |
| 2005/0018864 A1* | 1/2005 | Minervini | H01L 23/15 381/175 |
| 2006/0181385 A1* | 8/2006 | Hurley | H01L 23/5227 336/200 |
| 2011/0002076 A1* | 1/2011 | Sakai | H01L 27/0248 361/212 |
| 2015/0188312 A1 | 7/2015 | Kwok | |
| 2018/0261592 A1* | 9/2018 | Soejima | H01L 23/645 |
| 2018/0279057 A1* | 9/2018 | Khenkin | B81B 7/0064 |
| 2020/0252044 A1* | 8/2020 | Sekine | H03H 9/6406 |

* cited by examiner

SENSOR PACKAGE INCLUDING A SUBSTRATE WITH AN INDUCTOR LAYER

BACKGROUND

1. Field

The present disclosure is directed to a sensor package including a substrate with an inductor layer.

2. Introduction

Presently, electronic devices like mobile phones, personal computers, smart speakers, hearing aids, True Wireless Stereo (TWS) earphones among other host device applications commonly incorporate one or more small microphones and/or sensors. Advancements in micro and nanofabrication technologies have led to the development of microphones and sensors having progressively smaller size and different form-factors. For example, the once predominate use of electret microphones in these and other applications is being supplanted by capacitive Microelectromechanical Systems (MEMS) microphones for their low cost, small size and high sensitivity. Radio-Frequency (RF) signals conducted into a MEMS microphone though solder pads can result in demodulated signals in the audio band, which is considered noise.

BRIEF DESCRIPTION OF THE DRAWINGS

In order to describe the manner in which advantages and features of the disclosure can be obtained, a description of the disclosure is rendered by reference to specific embodiments thereof which are illustrated in the appended drawings. These drawings depict only example embodiments of the disclosure and are not therefore considered to limit its scope. The drawings may have been simplified for clarity and are not necessarily drawn to scale.

DETAILED DESCRIPTION

Embodiments can provide a sensor package including a substrate with an inductor layer. According to a possible embodiment, a sensor package can include a substrate including a plurality of layers. The plurality of layers can include a first pair of layers and a second pair of layers different from the first pair of layers. The substrate can have a first side and a second side opposite the first side. The sensor package can include a transducer coupled to the second side of the substrate. The sensor package can include an inductor electrically coupled to the transducer. The inductor can be configured as a single layer trace on an inductor layer within the substrate and disposed between the first pair of layers within the substrate. The first pair of layers can be more distal from the second side of the substrate than the second pair of layers.

RF signals conducted into a MEMS microphone though solder pads can result in demodulated signals in the audio band, which can be considered noise. RF filters can be employed in a microphone Printed Circuit Board (PCB), can include capacitors, and can include resistors. The capacitor element can be inexpensive and therefore can be present as a bare minimum. Adding resistors can be costly and can incur penalties that include reduced electrostatic discharge robustness and electrical current limits. Inductors can be used in lieu of resistors.

Inductors can be used to increase the electrical impedance of a microphone nodes at RF frequencies, effectively acting as filters or mismatch mechanisms. An inductor can be created as a single layer trace, such as a planar coil, in a multi-layer PCB. A possible implementation can involve a series inductor that can follow a shunt capacitor. The shunt capacitor can precede the series inductor to minimize the RF current through the inductor when high RF current through the inductor results in heating and associated mechanical distortion, which can emerge as acoustic output. For this reason, according to a possible implementation, the inductor can be on a layer of the PCB that is the furthest possible from the top layer on which a MEMS microphone or sensor is mounted. For example, the inductor can be placed on a layer directly above solder pads, such as in a six-layer PCB structure. The planar inductors may not be stacked, such as an inductor on fifth layer and an inductor on a second layer, when resulting magnetic attraction or repulsion between inductors cause mechanical excitation of the MEMS microphone or sensor. An inductor can also be used on the ground return of an entire sensor package such that all ground currents pass through the inductor, such as when the inductor layer is sufficiently distanced from the MEMS, where the inductor can serve as a filter for all nodes.

Figure 1:
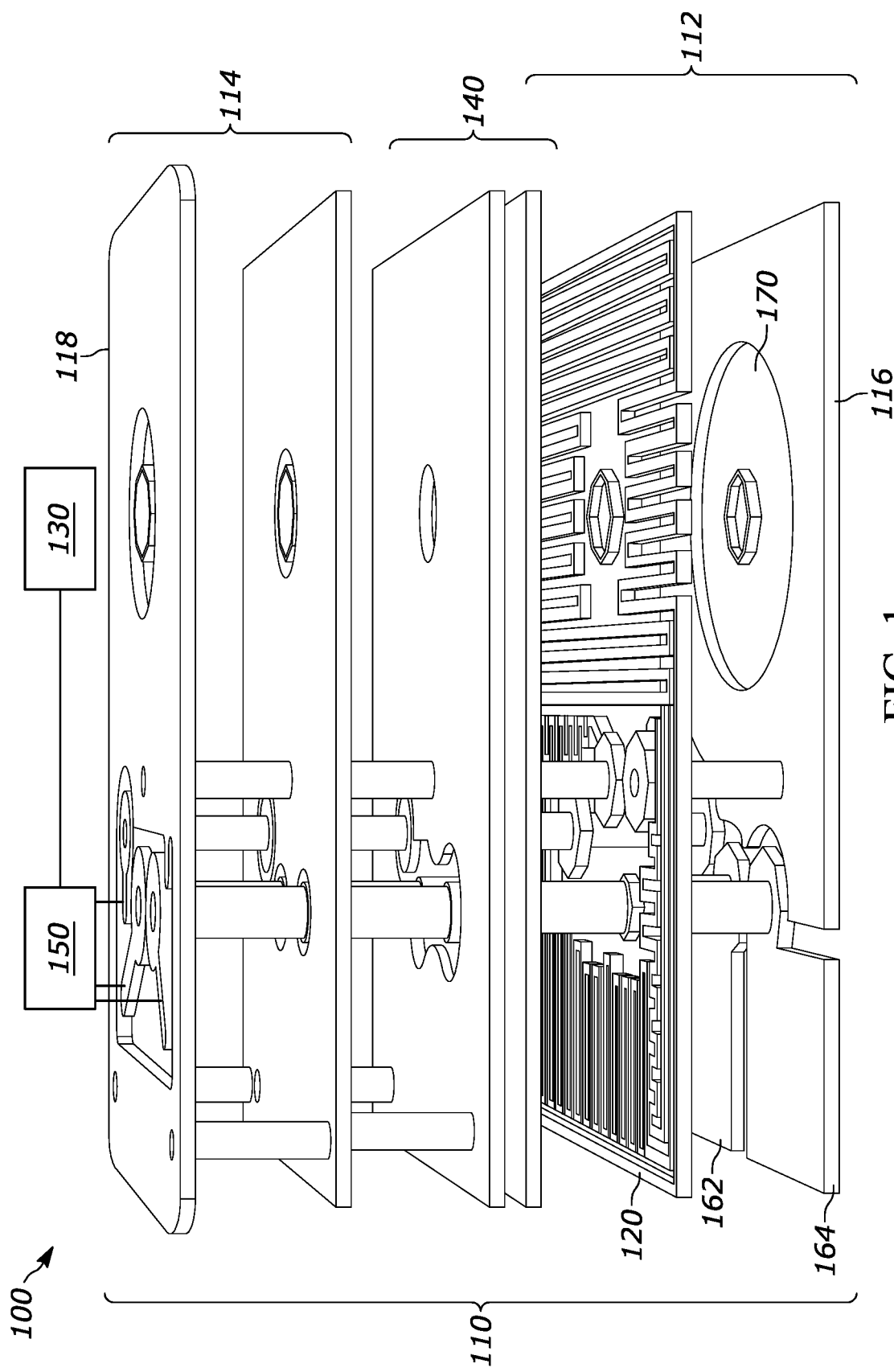
FIG. 1 is an example illustration of a sensor package with an entire ground choked according to a possible embodiment.
Figure 2:
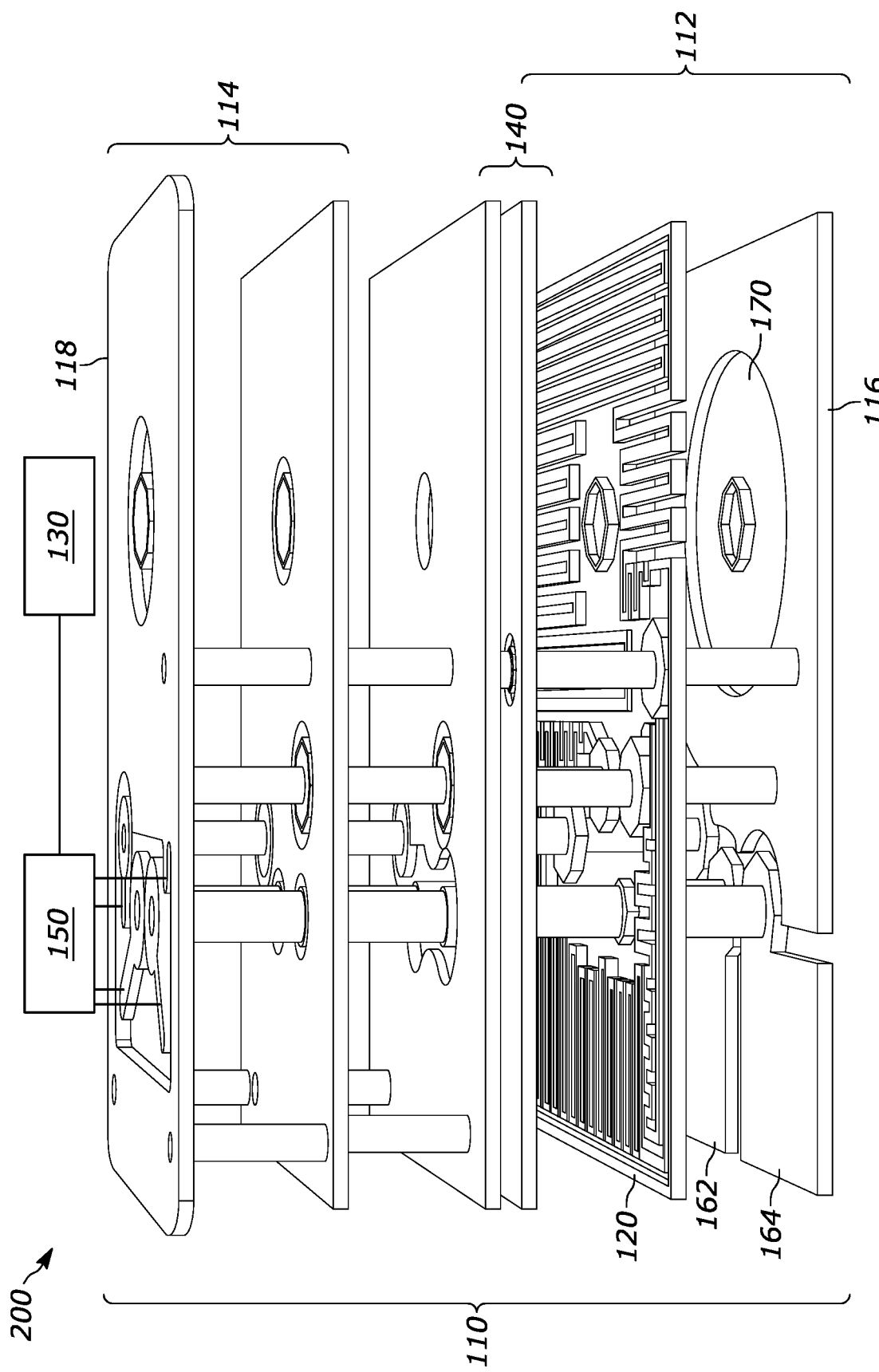
FIG. 2 is an example illustration of a sensor package with an Application Specific Integrated Circuit (ASIC) ground choked according to a possible embodiment.
Figure 3:
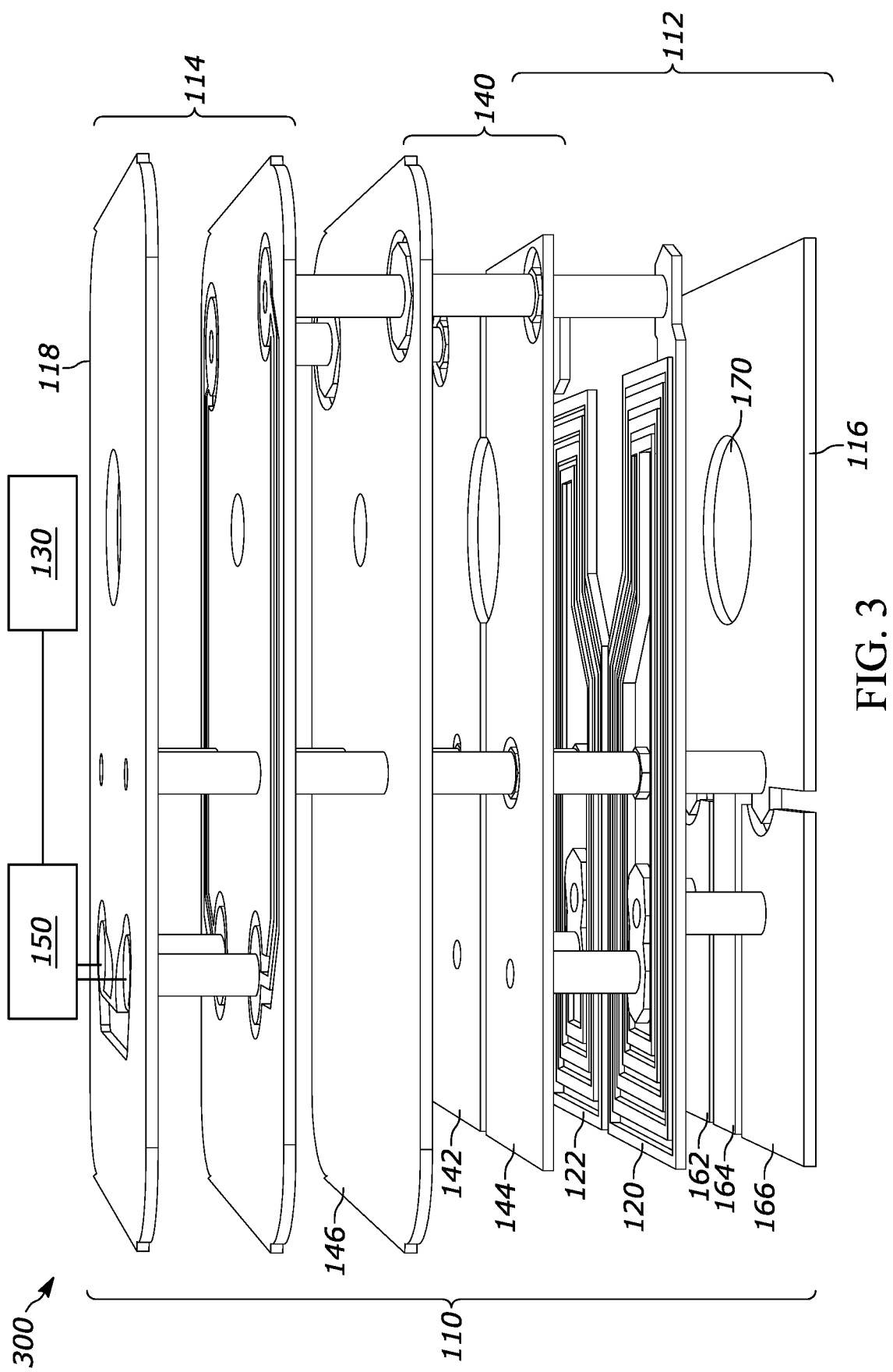
FIG. 3 is an example illustration of a sensor package with per node filters according to a possible embodiment.
Figure 7:
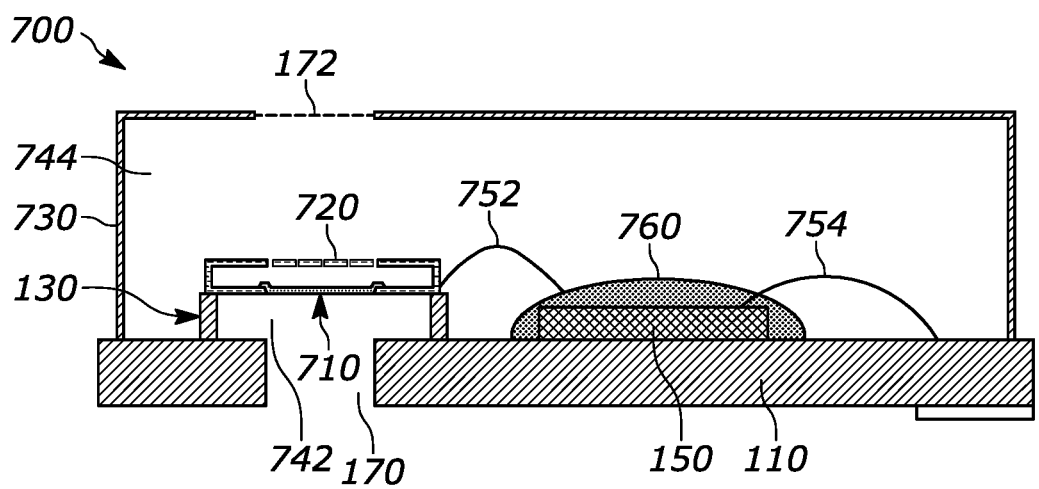
FIG. 7 is an example illustration of a sensor package including a cover according to a possible embodiment.
Figure 8:
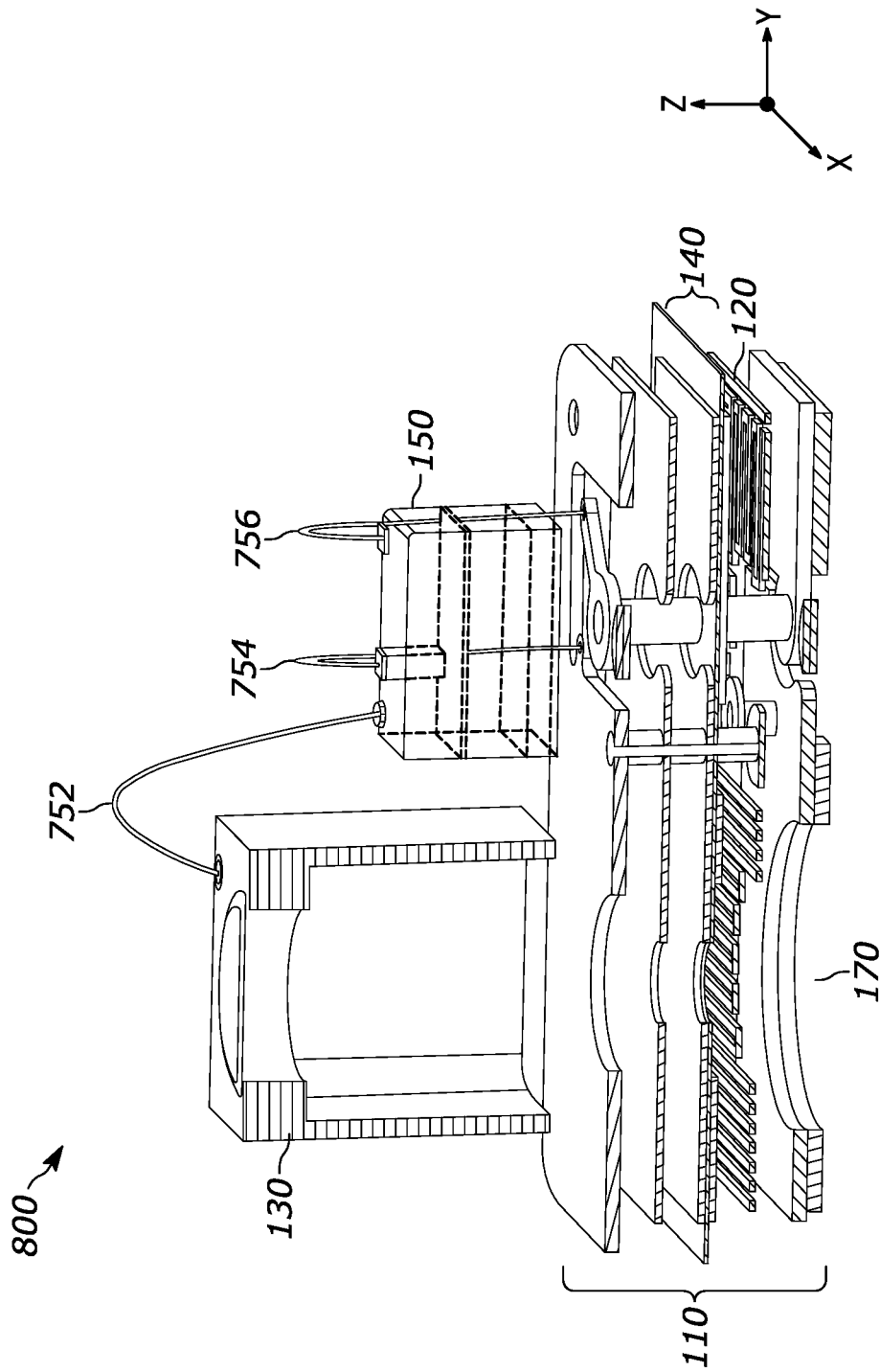
FIG. 8 is an example illustration of an expanded view of a sensor package according to a possible embodiment.

FIGS. 1-3, 7, and 8 are example illustrations of sensor packages 100, 200, 300, 700 and 800 according to various embodiments. For example, FIG. 1 is an example illustration of a sensor package 100 with an entire ground choked according to a possible embodiment. FIG. 2 is an example illustration of a sensor package 200 with an ASIC ground choked according to a possible embodiment. FIG. 3 is an example illustration of a sensor package 300 with per node filters according to a possible embodiment. FIG. 7 is an example illustration of a sensor package 700 including a cover 730 according to a possible embodiment. FIG. 8 is an example illustration of an expanded view of a sensor package 800 according to a possible embodiment. According to a possible embodiment, the sensor package can be a MEMS sensor package.

According to various possible embodiments, a sensor package can include a substrate 110 including a plurality of layers including a first pair of layers 112 and a second pair of layers 114 different from the first pair of layers 112. The plurality of layers can comprise at least three layers. The substrate 110 can have a first side 116 and a second side 118 opposite the first side 116. The substrate 110 can be a Printed Circuit Board (PCB). For example, the substrate 110 can be a multi-layer PCB. The substrate 110 can also include a sound port 170. The sensor package can include a transducer 130 coupled to the second side 118 of the substrate 110.

The sensor package can include an inductor 120 electrically coupled to the transducer 130. For example, the inductor 120 can be electrically coupled to the transducer 130 via the ASIC 150. The inductor 120 can be configured as a single layer trace on an inductor layer within the substrate 110 and disposed between the first pair of layers 112 within the substrate 110. The inductor 120 can be created as a single layer trace in a multi-layer PCB. The single layer trace can be a planar coil, meandering lines, or any other trace that occupies a single layer of the substrate 110. There can also be other elements on the inductor layer besides the single layer trace for the inductor 120. According to possible embodiments, the plurality of layers can include at least four layers. The inductor 120 can be an inductor layer of the at least four layers and the capacitor 140 can be two layers of the at least four layers.

Layers can be made of metal cladding. The metal cladding can be copper, gold, or any other metal or conductive material that can be etched, grown, or otherwise used as a layer. A metal layer can be a metal plane in a stack-up of a PCB.

The first pair of layers 112 can be more distal from the second side 118 of the substrate 110 than the second pair of layers 114. The first pair of layers 112 and the second pair of layers 114 may or may not share a common layer. The structure and routing on the layers can be different for different embodiments. For example, different the electrical schematics may use different structural layouts.

The inductor 120 can be on a layer of the substrate 110 that is the furthest possible from a top layer, such as the substrate layer with the second side 118, on which the transducer 130 can be mounted. For example, the inductor 120 can be on a layer next to a bottom layer, such as the layer with the substrate first side 116, or can be part of the bottom layer itself.

Referring to FIG. 3, the inductor 120 can comprise multiple inductors, such as inductors 120 and 122 or more inductors, on the inductor layer. The capacitor 140 can also comprise multiple capacitors. For example, one layer can include multiple plates 142 and 144 of different capacitors and another layer can include one plate 146 that is common to the different capacitors. Multiple capacitors can also be located on different layers.

Referring to FIG. 1-3, according to possible embodiments, the sensor package 110 can also include a capacitor 140 electrically coupled to the inductor 120. According to a possible embodiment, the capacitor 140 can electrically precede a series inductor 120 in a direction from a microphone solder pad, such as solder pads 162 and 164, to the ASIC 150 to minimize RF current through the inductor 120. According to other possible embodiments the inductor 120 can electrically precede the capacitor 140.

The capacitor 140 can be physically located within the substrate 110. For example, an electrical location can be different from a physical location. To elaborate, one element can be electrically coupled or electrically located between two elements without being physically located between the two elements.

According to possible embodiments, the sensor package can include an ASIC 150 coupled to the second side 118 of the substrate 110. The inductor 120 can be electrically coupled between the ASIC 150 and the capacitor 140.

According to possible embodiments, the sensor package can also include a plurality of solder pads 162, 164, and 166. For example, at least a part of a layer of the plurality of layers can include a solder pad located on a layer including the first side 116 of the substrate 110. The inductor 120 can be located immediately adjacent to solder pad, such as solder pads 162 and 164, between the solder pad and the second side 118 of the substrate 110. As a further example, the inductor 120 can be placed on the layer directly above the solder pads 162 and 164, in a six-layer PCB structure. Thus, the inductor 120 can be on an available layer furthest from the transducer 130.

Figure 4:
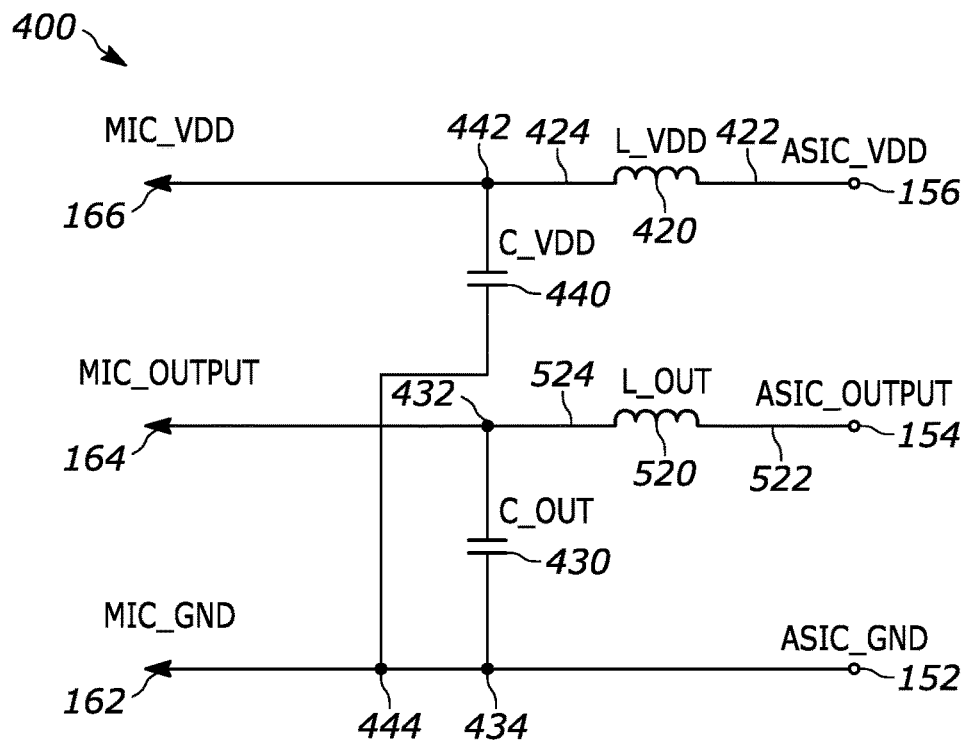
FIG. 4 is an example circuit diagram with an inductor on an input and output according to a possible embodiment.
Figure 5:
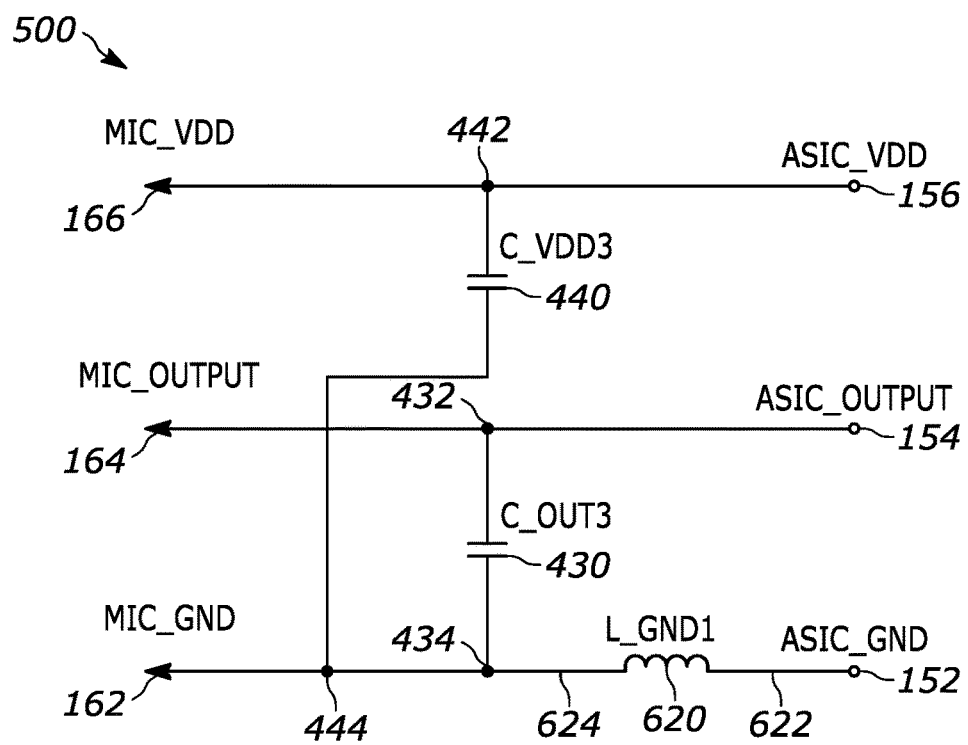
FIG. 5 is an example circuit diagram with an inductor on a ground according to a possible embodiment.
Figure 6:
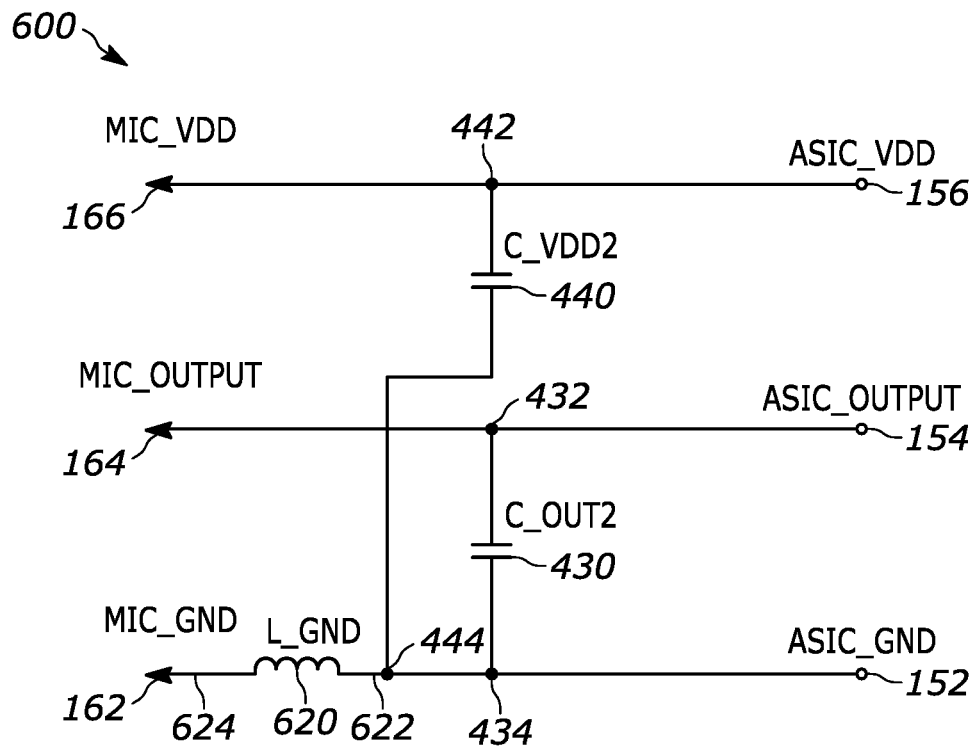
FIG. 6 is an example circuit diagram with an inductor on a ground according to another possible embodiment.

FIGS. 4-6 are example circuit diagrams 400, 500, and 600 of sensor packages according to various embodiments. For example, FIG. 4 is an example circuit diagram 400 with an inductor on an input and output according to a possible embodiment. FIG. 5 is an example circuit diagram 500 with an inductor on a ground according to a possible embodiment. FIG. 6 is an example circuit diagram 600 with an inductor on a ground according to another possible embodiment.

The circuit diagrams 400, 500, and 600 can include solder pads 162, 164, and 166. The solder pad 162 can be a ground solder pad, the solder pad 164 can be an output solder pad, and the solder pad 166 can be a voltage supply solder pad. The ground solder pad 162 can be the actual ground of the sensor package. A microphone solder pad, such as the solder pads 162, 164, and 166, can be or can be part of a surface-mount interface.

The circuit diagrams 400, 500, and 600 can also include ASIC contacts 152, 154, and 156 corresponding to the ASIC 150. The ASIC contact 152 can be a ground contact, the ASIC contact 154 can be an ASIC output contact, and the ASIC contact 156 can be a voltage supply contact. The ASIC contacts 152, 154, and 156 can be ASIC bond pads, solder bumps for a flip chip application, or any other contacts.

The circuit diagrams 400, 500, and 600 can include at least one inductor 420, 520, and 620, such as the inductor 120. The at least one inductor 420, 520, and 620 can include a first contact 422, 522, and 622, respectively, and can include a second contact 424, 524, and 624, respectively.

The circuit diagrams 400, 500, and 600 can include at least one capacitor 430 and 440, such as the capacitor 140. The capacitor 430 can include a first contact 432 and a second contact 434. The capacitor 440 can include a first contact 442 and a second contact 444.

According to a possible embodiment of the circuit diagram 400, the capacitor 430 or 440 can include the first contact 432 or 442 and the second contact 434 or 444. The capacitor second contact 434 or 444 can be electrically coupled to a ground, such as the solder pad ground 162 and/or the ASIC ground contact 152. The inductor 420 or 520 can include a first contact 422 or 522 electrically coupled to the ASIC, such as the ASIC contact 154 or 156. The inductor 420 or 520 can include a second contact 424 or 524 electrically coupled to the capacitor first contact 442 or 432.

According to another possible embodiment of the circuit diagram 500, the capacitor 430 or 440 can include a first contact 432 or 442 and a second contact 434 or 444. The capacitor second contact 434 or 444 can be electrically coupled to a ground. The first ASIC contact 154 or 156 can be electrically coupled to the capacitor first contact 432 or 442. The inductor first contact 622 can be electrically coupled to the ASIC ground contact 152. The inductor second contact 642 can be electrically coupled to the capacitor second contact 434 or 444. More contacts, such as more solder pads, can use more inductors. For example, a sensor package can have more than one output. Thus, there can be more solder pads. As many inductors can be used as solder pad nodes there are to protect.

According to another possible embodiment of the circuit diagram 600, the first capacitor contact 432 or 442 can be electrically coupled to the solder pad first contact 164 or 166 and the second capacitor contact 434 or 444 can be electrically coupled to a ground. The inductor first contact 622 can be electrically coupled to the capacitor second contact 434 or 444 and the inductor second contact 624 can be electrically coupled to the solder pad ground contact 162.

Referring to possible embodiments of FIGS. 7 and 8, the transducer 130 can include a diaphragm 710 and a back plate 720. The substrate 110 can be a base including a sound port 170 acoustically coupled to the diaphragm 710. For example, the substrate 110 can be a base of a MEMS sensor package. The sound port 170 can be an aperture running through all of the layers of the substrate 110.

According to a possible embodiment, the sensor package can include a cover 730 coupled to the substrate 110. The cover 730 can cover the transducer 130. Instead of the substrate having the sound port 170, the cover 730 can have a sound port 172 acoustically coupled to the diaphragm 710. For example, alternately, or in addition to the sound port 170, a sound port can be located anywhere else on the sensor package of any of the embodiments to acoustically couple the diaphragm 710 to an area external to the sensor package.

Furthermore, the sensor package 700 can include a front volume 742 and a back volume 744, where the labels "front" and "back" can be switched if the sound port is the sound port 172 on the cover 730 instead of the sound port 170 on the substrate 110. The sensor package 700 can also include at least one electrical lead 752 from the transducer 130 to the ASIC 150 and at least one electrical lead 754 and/or 756 from the ASIC 150 to the substrate 110. The sensor package 700 can further include a protective coating 760 over the ASIC 150.

According to a possible embodiment, there may be no other inductors other than the inductor 120 between layers in a direction perpendicular to a plane of the inductor layer, such as along the z-axis shown with respect to the sensor package 800. For example, planar inductors may not be stacked, such as with an inductor on one layer and an inductor above or below it on another layer.

According to related possible embodiments, a sensor package can include a PCB including at least four layers. The at least four layers can include a bottom layer and a top layer opposite the bottom layer. The PCB can include a sound port including an aperture running through all four layers of the PCB.

The sensor package can include a MEMS transducer mounted on the top layer of the PCB. The MEMS transducer can include a diaphragm and a back plate. The diaphragm can be acoustically coupled to the sound port.

The sensor package can include an inductor coupled to the MEMS transducer. The inductor can be configured as a single layer trace on an inductor layer within the PCB. The inductor layer can be one of the at least four layers. The inductor layer can be a layer closer to the bottom layer than the top layer of the at least four layers.

According to a possible embodiment, the sensor package can include a capacitor electrically coupled to the inductor. According to a possible embodiment, the capacitor can include two layers of the at least four layers.

According to a possible embodiment, the sensor package can include an ASIC coupled to the top layer of the PCB. The inductor can be electrically coupled between the ASIC and the capacitor.

According to a possible embodiment, the capacitor can include a first contact and a second contact. The capacitor second contact can be electrically coupled to a ground. The inductor can include a first contact electrically coupled to the ASIC and can include a second contact electrically coupled to the capacitor first contact.

According to a possible embodiment, the capacitor can include a first contact and a second contact. The capacitor second contact can be electrically coupled to a ground. The ASIC can include a first contact electrically coupled to the capacitor first contact and can include a ground contact. The inductor can include a first contact electrically coupled to the ASIC ground contact and can include a second contact electrically coupled to the capacitor second contact.

According to a possible embodiment, the sensor package can include at least one solder pad including a first contact and a second contact. The second contact can be a ground contact. The capacitor can include a first contact electrically coupled to the solder pad first contact and can include a second contact electrically coupled to a ground. The inductor can include a first contact electrically coupled to the capacitor second contact and can include a second contact electrically coupled to the solder pad ground contact.

In certain implementations, the capacitor can precede the inductor. For example, in some cases, if the inductor precedes the capacitor, there can be high RF currents through the conductor, when can cause thermo-acoustic noise. In certain implementations, the inductor can be placed on a layer further from a MEMS transducer. For example, in some cases, if the inductor is placed on a PCB layer close to the MEMS transducer, regardless of its position relative to the capacitor, or L-net topology, there can be a performance degradation due to thermo-acoustic noise. In certain implementations, the planar inductors may not be stacked. For example, in some cases, the resulting magnetic attraction or repulsion between inductors may cause mechanical excitation of the MEMS.

While this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The phrase "at least one of," "at least one selected from the group of," or "at least one selected from" followed by a list is defined to mean one, some, or all, but not necessarily all of, the elements in the list. The terms "comprises," "comprising," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is not admitted as prior art, is written as the inventor's own understanding of the context of some embodiments at the time of filing, and includes the inventor's own recognition of any problems with existing technologies and/or problems experienced in the inventor's own work.

We claim:

1. A microelectromechanical systems (MEMS) sensor package comprising:
    a substrate including a plurality of layers including a first pair of layers and a second pair of layers different from the first pair of layers, the substrate having a first side and a second side opposite the first side;
    a transducer coupled to the second side of the substrate; and
    an inductor electrically coupled to the transducer, the inductor configured as a single layer trace on an inductor layer within the substrate and disposed between the first pair of layers within the substrate, where the first pair of layers is more distal from the second side of the substrate than the second pair of layers,
    wherein the transducer comprises a diaphragm and a back plate,
    wherein the substrate is a base including a sound port acoustically coupled to the diaphragm, where the sound port comprises an aperture running through all of the layers of the substrate,
    wherein there are no other inductors between layers in a direction perpendicular to a plane of the inductor layer, and
    wherein the sound port passes between traces of the inductor.

2. The MEMS sensor package according to claim 1, further comprising a capacitor electrically coupled to the inductor.

3. The MEMS sensor package according to claim 2, wherein the capacitor is physically located within the substrate.

4. The MEMS sensor package according to claim 2, further comprising an application specific integrated circuit coupled to the second side of the substrate,
    wherein the inductor is electrically coupled between the application specific integrated circuit and the capacitor.

5. The MEMS sensor package according to claim 4,
    wherein the capacitor comprises a first contact and a second contact, the capacitor second contact electrically coupled to a ground, and
    wherein the inductor comprises a first contact electrically coupled to the application specific integrated circuit and comprises a second contact electrically coupled to the capacitor first contact.

6. The MEMS sensor package according to claim 4,
    wherein the capacitor comprises a first contact and a second contact, the capacitor second contact electrically coupled to a ground,
    wherein the application specific integrated circuit comprises a first contact electrically coupled to the capacitor first contact and comprises a ground contact, and
    wherein the inductor comprises a first contact electrically coupled to the application specific integrated circuit ground contact and comprises a second contact electrically coupled to the capacitor second contact.

7. The MEMS sensor package according to claim 2, further comprising at least one solder pad including a solder pad first contact and a solder pad second contact, wherein the solder pad second contact is a solder pad ground contact,
    wherein the capacitor comprises a capacitor first contact electrically coupled to the solder pad first contact and comprises a capacitor second contact electrically coupled to a ground, and
    wherein the inductor comprises a first contact electrically coupled to the capacitor second contact and comprises a second contact electrically coupled to the solder pad ground contact.

8. The MEMS sensor package according to claim 1,
    wherein at least a part of a layer of the plurality of layers comprises a solder pad located on the first side of the substrate, and
    wherein the inductor is located immediately adjacent to the solder pad between the solder pad and the second side of the substrate.

9. The MEMS sensor package according to claim 1, wherein the plurality of layers comprises at least four layers, wherein the inductor comprises an inductor layer of the at least four layers, and wherein the sensor package comprises a capacitor comprising two layers of the at least four layers.

10. A sensor package comprising:
    a printed circuit board including at least four layers, the at least four layers including a bottom layer and a top layer opposite the bottom layer, the printed circuit board including a sound port comprising an aperture running through all four layers of the printed circuit board;
    a microelectromechanical systems transducer mounted on the top layer of the printed circuit board, the microelectromechanical systems transducer comprising a diaphragm and a back plate, the diaphragm acoustically coupled to the sound port; and
    an inductor coupled to the microelectromechanical systems transducer, where the inductor is configured as a single layer trace on an inductor layer within the printed circuit board, the inductor layer being one of the at least four layers, the inductor layer comprising a layer closer to the bottom layer than the top layer of the at least four layers,
    wherein the microelectromechanical systems transducer comprises a diaphragm and a back plate, and
    wherein the sensor package comprises a sound port acoustically coupled to the diaphragm,
    wherein no inductor configured as a single layer trace within the printed circuit board and electrically coupled to the microelectromechanical systems transducer overlaps, in a direction perpendicular to a plane of the inductor layer, with any other inductor configured as a single layer trace within the printed circuit board and electrically coupled to the microelectromechanical systems transducer, and
    wherein the sound port passes between traces of the inductor.

11. The sensor package according to claim 10, further comprising a capacitor electrically coupled to the inductor.

12. The sensor package according to claim 11, wherein the capacitor comprises two layers of the at least four layers.

13. The sensor package according to claim 11, further comprising an application specific integrated circuit coupled to the top layer of the printed circuit board,
    wherein the inductor is electrically coupled between the application specific integrated circuit and the capacitor.

14. The sensor package according to claim 13,
wherein the capacitor comprises a first contact and a second contact, the capacitor second contact electrically coupled to a ground, and
wherein the inductor comprises a first contact electrically coupled to the application specific integrated circuit and comprises a second contact electrically coupled to the capacitor first contact.

15. The sensor package according to claim 13,
wherein the capacitor comprises a first contact and a second contact, the capacitor second contact electrically coupled to a ground,
wherein the application specific integrated circuit comprises a first contact electrically coupled to the capacitor first contact and comprises a ground contact, and
wherein the inductor comprises a first contact electrically coupled to the application specific integrated circuit ground contact and comprises a second contact electrically coupled to the capacitor second contact.

16. The sensor package according to claim 11, further comprising at least one solder pad including a solder pad first contact and a solder pad second contact, wherein the second contact is a solder pad ground contact,
wherein the capacitor comprises a capacitor first contact electrically coupled to the solder pad first contact and comprises a capacitor second contact electrically coupled to a ground, and
wherein the inductor comprises a first contact electrically coupled to the capacitor second contact and comprises a second contact electrically coupled to the solder pad ground contact.

* * * * *